US010515956B2

(12) United States Patent
Lee et al.

(10) Patent No.: US 10,515,956 B2
(45) Date of Patent: Dec. 24, 2019

(54) SEMICONDUCTOR DEVICES HAVING FIN FIELD EFFECT TRANSISTOR (FINFET) STRUCTURES AND MANUFACTURING AND DESIGN METHODS THEREOF

(71) Applicant: Taiwan Semiconductor Manufacturing Company, Ltd., Hsinchu (TW)

(72) Inventors: Tung Ying Lee, Hsinchu (TW); Wen-Huei Guo, Chu-bei (TW); Chih-Hao Chang, Chu-bei (TW); Shou-Zen Chang, Hsinchu (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 16/042,064

(22) Filed: Jul. 23, 2018

(65) Prior Publication Data
US 2018/0350802 A1   Dec. 6, 2018

Related U.S. Application Data

(60) Continuation-in-part of application No. 15/789,488, filed on Oct. 20, 2017, now Pat. No. 10,037,994.
(Continued)

(51) Int. Cl.
*H01L 27/088* (2006.01)
*H01L 29/66* (2006.01)
(Continued)

(52) U.S. Cl.
CPC .. *H01L 27/0886* (2013.01); *H01L 21/823431* (2013.01); *H01L 21/823437* (2013.01);
(Continued)

(58) Field of Classification Search
CPC ........ H01L 27/0886; H01L 21/823431; H01L 21/845; H01L 27/0629; H01L 29/0642; H01L 29/66636; H01L 29/6681
See application file for complete search history.

(56) References Cited

U.S. PATENT DOCUMENTS

| 5,888,297 A | 3/1999 | Ogura |
| 7,187,046 B2 | 3/2007 | Wu et al. |
(Continued)

FOREIGN PATENT DOCUMENTS

| CN | 1906769 A | 1/2007 |
| CN | 101533843 A | 9/2009 |
(Continued)

OTHER PUBLICATIONS

"Proximate." Collins English Dictionary—Complete and Unabridged. 1991, 1994, 1998, 2000, 2003. HarperCollins Publishers Oct. 15, 2013 <http://www.thefreedictionary.com/proximate>, 2 pages.
(Continued)

*Primary Examiner* — Karen Kusumakar
(74) *Attorney, Agent, or Firm* — Slater Matsil, LLP

(57) ABSTRACT

Semiconductor devices and manufacturing and design methods thereof are disclosed. In one embodiment, a semiconductor device includes an active FinFET disposed over a workpiece comprising a first semiconductive material, the active FinFET comprising a first fin. An electrically inactive FinFET structure is disposed over the workpiece proximate the active FinFET, the electrically inactive FinFET comprising a second fin. A second semiconductive material is disposed between the first fin and the second fin.

20 Claims, 13 Drawing Sheets

Related U.S. Application Data which is a continuation of application No. 14/820,794, filed on Aug. 7, 2015, now Pat. No. 9,818,745, which is a division of application No. 13/410,207, filed on Mar. 1, 2012, now Pat. No. 9,105,744.

(51) Int. Cl.
| | | |
|---|---|---|
| H01L 21/84 | (2006.01) | |
| H01L 21/8234 | (2006.01) | |
| H01L 27/06 | (2006.01) | |
| H01L 29/06 | (2006.01) | |
| H01L 27/02 | (2006.01) | |
| H01L 29/78 | (2006.01) | |

(52) U.S. Cl.
CPC .... *H01L 21/823475* (2013.01); *H01L 21/845* (2013.01); *H01L 27/0266* (2013.01); *H01L 27/0629* (2013.01); *H01L 27/088* (2013.01); *H01L 29/0642* (2013.01); *H01L 29/6681* (2013.01); *H01L 29/66636* (2013.01); *H01L 29/78* (2013.01); *H01L 21/823481* (2013.01)

(56) References Cited

U.S. PATENT DOCUMENTS

| | | |
|---|---|---|
| 7,453,124 B2 | 11/2008 | Adan |
| 7,683,428 B2 | 3/2010 | Chidambarrao et al. |
| 7,723,171 B2 | 5/2010 | Yagishita et al. |
| 7,932,567 B2 | 4/2011 | Mizumura et al. |
| 8,129,750 B2 | 3/2012 | Becker et al. |
| 8,653,608 B2 | 2/2014 | Lee et al. |
| 2004/0195628 A1 | 10/2004 | Wu et al. |
| 2006/0175667 A1 | 8/2006 | Tsuchiaki |
| 2008/0099858 A1 | 5/2008 | Kawakita |
| 2008/0220582 A1 | 9/2008 | Yagishita et al. |
| 2008/0283925 A1 | 11/2008 | Berthold et al. |
| 2009/0050975 A1 | 2/2009 | Bryant et al. |
| 2009/0057781 A1* | 3/2009 | Anderson ....... H01L 21/823431 257/401 |
| 2011/0068407 A1 | 3/2011 | Yeh et al. |
| 2011/0089975 A1 | 4/2011 | Yamazaki et al. |
| 2012/0001197 A1 | 1/2012 | Liaw et al. |
| 2012/0018730 A1 | 1/2012 | Kanakasabapathy et al. |

FOREIGN PATENT DOCUMENTS

| | | |
|---|---|---|
| CN | 102034866 A | 4/2011 |
| CN | 102082175 A | 6/2011 |
| JP | 2006216833 A | 8/2006 |

OTHER PUBLICATIONS

"Coterminous." Merriam-Webster.com. Merriam-Webster, n.d. Web. Oct. 16, 2013. <http://www.merriam-webster.com/dictionary/coterminous>, 1 page.

"Substantially". Oxford Dictionaries. Oxford University Press, n.d. Web. Oct. 16, 2013. <http://oxforddictionaries.com/us/definition/american_english/substantially>, 1 page.

* cited by examiner

US 10,515,956 B2

SEMICONDUCTOR DEVICES HAVING FIN FIELD EFFECT TRANSISTOR (FINFET) STRUCTURES AND MANUFACTURING AND DESIGN METHODS THEREOF

PRIORITY CLAIM AND CROSS-REFERENCE

This patent application is a continuation of U.S. patent application Ser. No. 15/789,488, entitled "Semiconductor Devices having Fin Field Effect Transistor (FinFET) Structures and Manufacturing and Design Methods Thereof," filed Oct. 20, 2017, which is a continuation of U.S. patent application Ser. No. 14/820,794, entitled "Semiconductor Devices having Fin Field Effect Transistor (FinFET) Structures and Manufacturing and Design Methods Thereof," filed on Aug. 7, 2015, now U.S. Pat. No. 9,818,745 issued Nov. 14, 2017, which is a divisional of co-pending U.S. patent application Ser. No. 13/410,207, entitled "Semiconductor Devices having Fin Field Effect Transistor (FinFET) Structures and Manufacturing and Design Methods Thereof," filed on Mar. 1, 2012, now U.S. Pat. No. 9,105,744 issued Aug. 11, 2015 which are incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Multiple gate field-effect transistors (MuGFETs) are a recent development in semiconductor technology which typically are metal oxide semiconductor FETs (MOSFETs) that incorporate more than one gate into a single device. The multiple gates may be controlled by a single gate electrode, where the multiple gate surfaces act electrically as a single gate, or by independent gate electrodes. One type of MuG-FET is referred to as a FinFET, which is a transistor structure with a fin-like semiconductor channel that is raised vertically out of the semiconductor surface of an integrated circuit.

FinFETs are a relatively new technology in semiconductor devices. Improved design methods, manufacturing methods, and structures for semiconductor devices that include FinFETs are needed in the art.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Embodiments of the present disclosure are related to multiple gate semiconductor devices such as FinFETs. Novel semiconductor devices including active and inactive FinFETs, methods of manufacturing thereof, and design methods thereof will be described herein.

Figure 1:
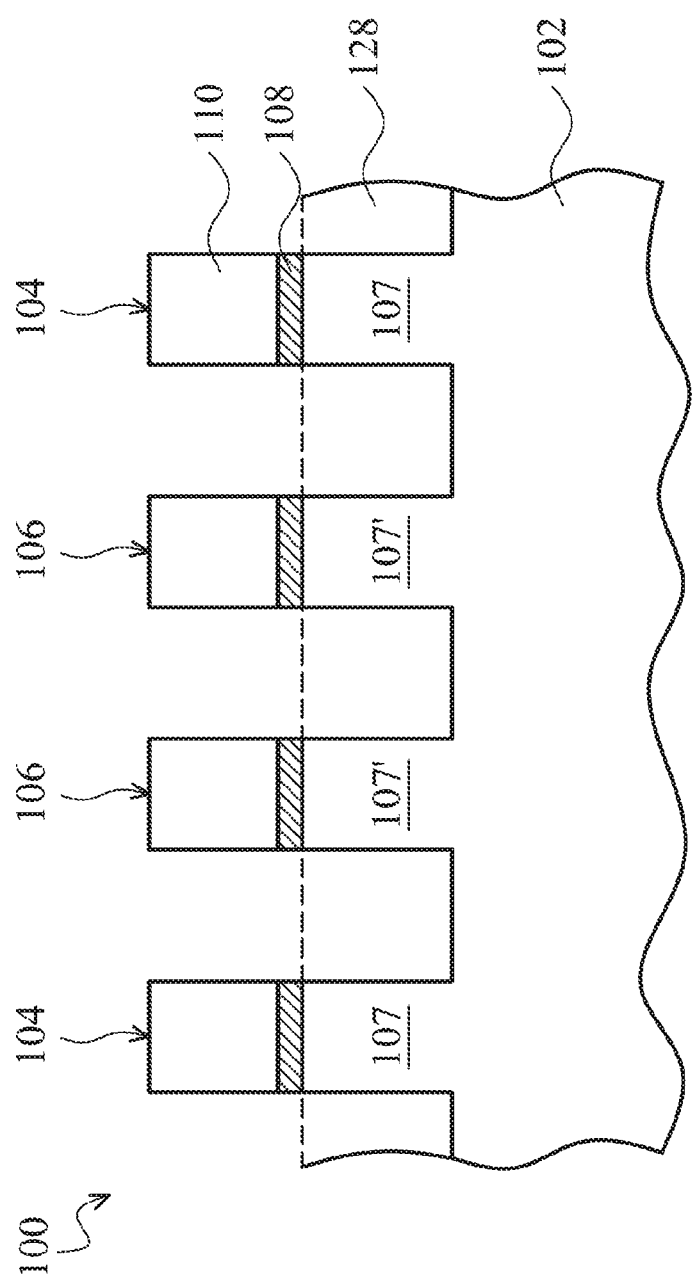
FIG. 1 shows a cross-sectional view of a portion of a semiconductor device in accordance an embodiment of the present disclosure that includes a plurality of active FinFETs and at least one electrically inactive FinFET structure.

Referring first to FIG. 1, a cross-sectional view of a portion of a semiconductor device 100 in accordance an embodiment of the present disclosure is shown. The semiconductor device 100 includes a plurality of active FinFETs 104 and at least one electrically inactive FinFET structure 106. The active FinFETs 104 comprise electrically active FinFETs or functioning FinFETs. By use of the term "active FinFET," it is not meant to imply the structures are powered up or performing an electrical function at the illustrated stage of manufacture. Rather, "active FinFETs" 104 are adapted to function electrically in a finished semiconductor device 100, when appropriately configured and powered. The active FinFETs 104 each include a channel region 107 in semiconductor region 102, which is comprised of a semiconductive material, a gate dielectric 108 comprising an insulating material disposed over the channel region 107, and a gate 110 comprising a semiconductive material, a conductive material, or combinations or multiple layers thereof, disposed over the gate dielectric 108. The channel regions 107 of the active FinFETs 104 are also referred to herein as first channel regions. The channel regions 107 are also referred to as fins 107.

The electrically inactive FinFET structures 106 are also referred to herein as inactive FinFET structures, inactive FinFETs, and/or dummy FinFETs, as examples. Throughout this disclosure, the terms "inactive FinFET" and "dummy FinFET" can be used interchangeably. The electrically inactive FinFET structures 106 are comprised of the same materials and the same material layers that the active FinFETs 104 are formed of, yet they are not adapted to function electrically in the finished semiconductor device 100. The inactive FinFET structures 106 each include a channel region 107', a gate dielectric 108 and a gate 110 comprising the same materials that the active FinFET structures 104 are comprised of, for example. The channel regions 107' of the inactive FinFET structures 106 are also referred to herein as second channel regions 107'. In accordance with some embodiments of the present disclosure, the inactive FinFETs 106 are not connected or coupled to an outside contact for making electrical contact outside of the semiconductor device 100.

The novel semiconductor device 100 includes at least one inactive FinFET 106 disposed between two of the active FinFETs 104. In the example shown in FIG. 1, two inactive FinFETs 106 are disposed between two active FinFETs 104. Alternatively, only one inactive FinFET 106, or three or more inactive FinFETs 106 may be disposed between two active FinFETs 104, depending on the design and layout of the semiconductor device 100.

In some embodiments, a semiconductive material 128 (shown in phantom in FIG. 1) may be formed between channel regions 107 and 107' of the active and inactive FinFETs 104 and 106, between pairs of channel regions 107 of adjacent active FinFETs 104, and between pairs of channel regions 107' of adjacent inactive FinFETs 106. The semiconductive material 128 is also referred to herein as a second semiconductive material. The second semiconductive material 128 may comprise the same type of material as the first semiconductive material of the semiconductor region 102, or alternatively, the second semiconductive material 128 may comprise a different type of semiconductive material as the first semiconductive material of the semiconductor region 102.

In some applications, it may be desirable to form epitaxial source/drain regions between the channel regions 107 and/or 107' using the semiconductive material 128. The presence of the novel inactive FinFETs 106 advantageously improves the epitaxial growth of the semiconductive material 128, ensuring that the space between the channel regions 107 and/or 107' is filled completely to a top surface of a semiconductor region 102, e.g., to at least the top surface of the channel regions 107 and 107', in some embodiments. In some embodiments, epitaxially growing the second semiconductive material 128 comprises forming a second semiconductive material 128 that is merged over an underlying topography over the semiconductor region_102, for example.

Figure 2:
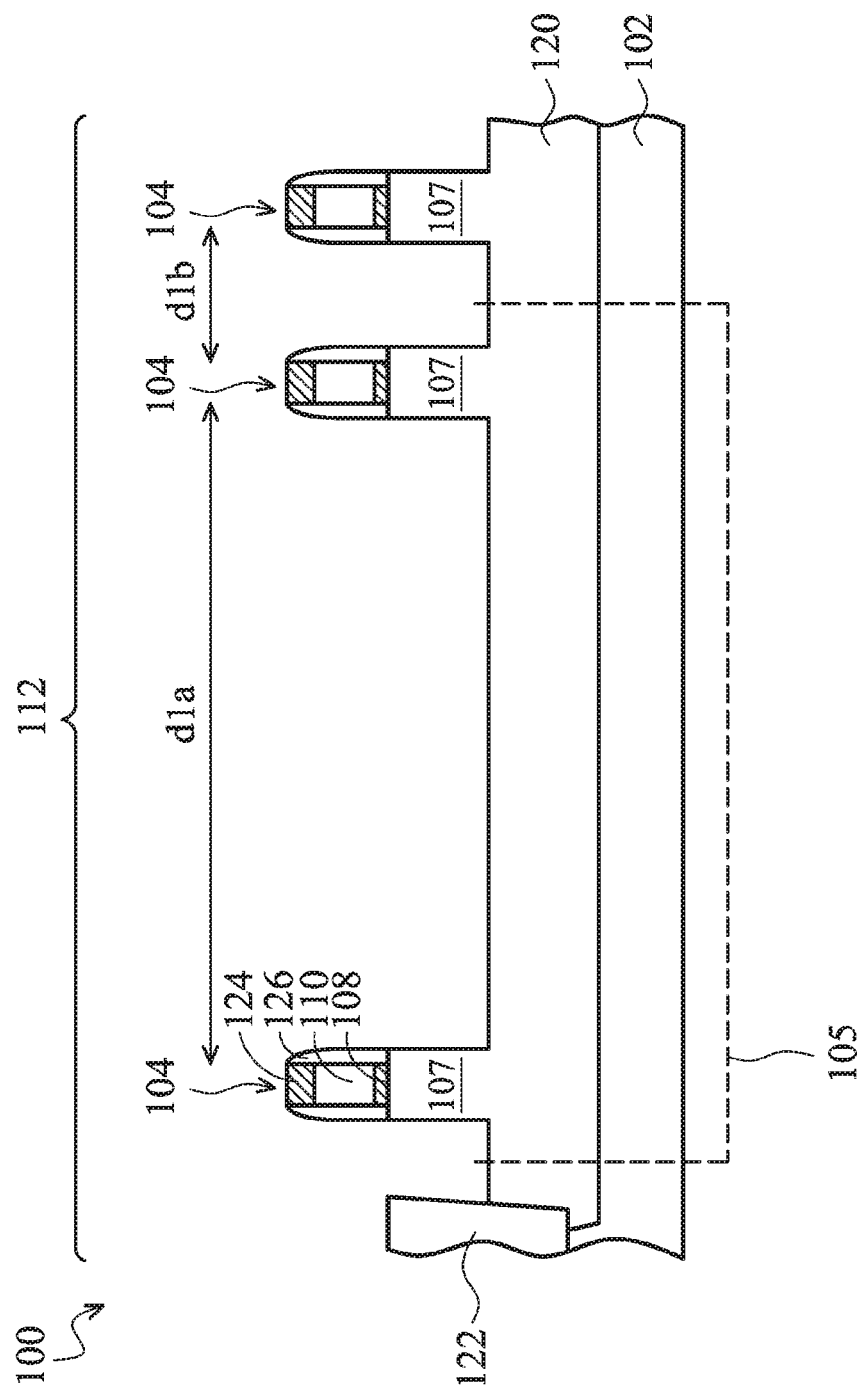
FIG. 2 is a cross-sectional view of an initial layout of a semiconductor device that includes a plurality of active FinFETs.
Figure 3:
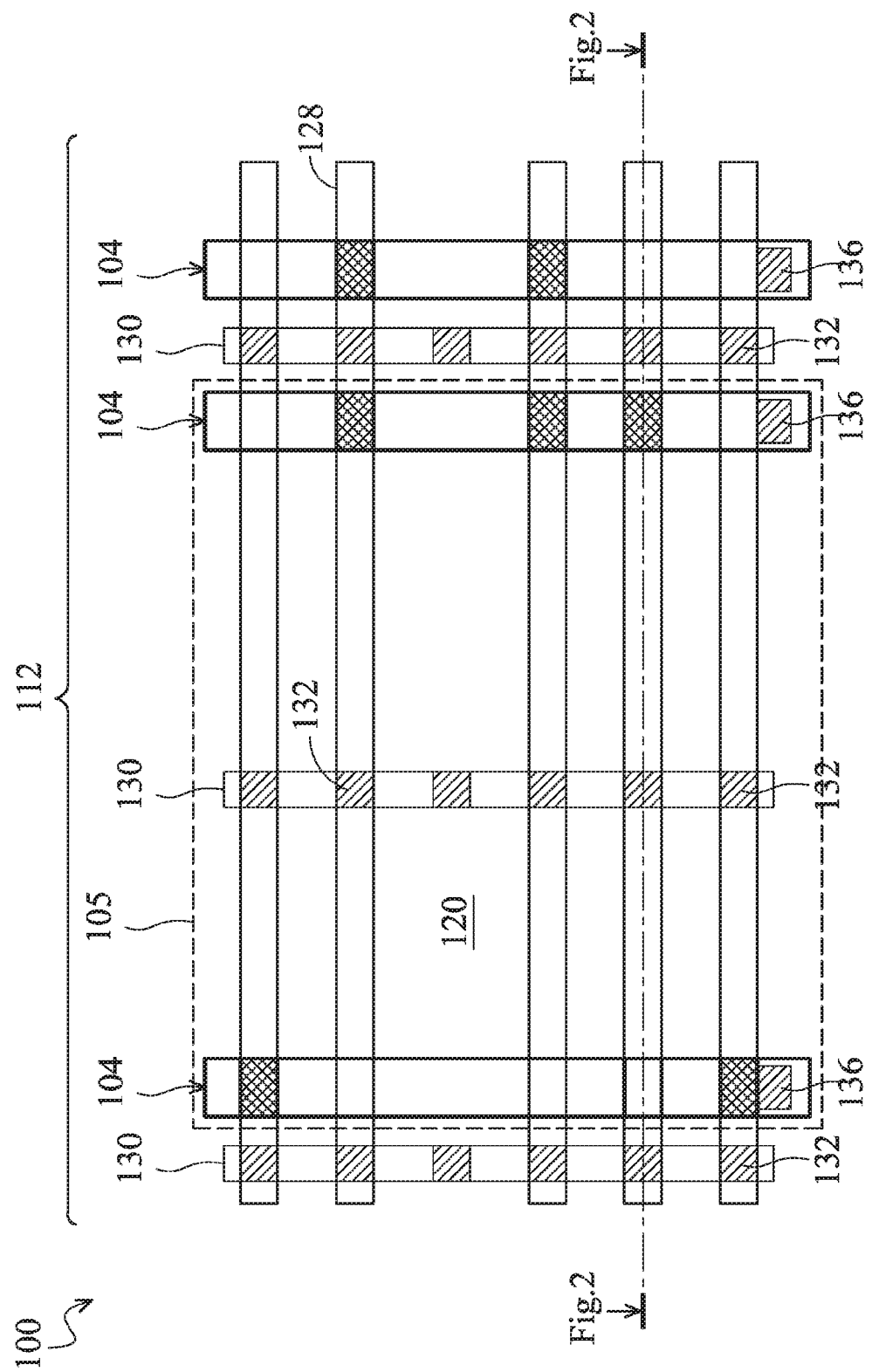
FIG. 3 is a top view of the initial layout shown in FIG. 2.

The inactive FinFETs 106 may be implemented in a design of a semiconductor device 100 by first, designing a layout for the active FinFETs 104. FIG. 2 is a cross-sectional view of an initial layout that includes a plurality of active FinFETs 104, as an example. FIG. 3 is a top view of the initial layout of the semiconductor device 100 shown in FIG. 2. FIG. 2 shows a cross-section of the top view shown in FIG. 3. The structure shown in FIGS. 2 and 3 may not be actually fabricated in accordance with some embodiments, but is shown to illustrate an initial design layout before including the inactive FinFETs 106 in the layout. The semiconductor device 100 layout shown is merely an example, and other layouts and designs may also be used. One or more active FinFETs 104 may be formed in blocks 105 which are repeated several (e.g., dozens or hundreds of times) across a surface of the fin 102 in some embodiments, for example. The blocks 105 may comprise circuit blocks comprising a plurality of PFETs or a plurality of NFETs, for example, wherein PFETs are not combined with NFETs and vice versa, in some embodiments.

The semiconductor device 100 includes a semiconductor region 102 that may comprise a P-substrate, for example, although alternatively, the semiconductor region 102 may comprise an N-substrate. A well 120 comprising an N well (or alternatively a P well) may be formed proximate the top of the semiconductor region_102, as shown. The active FinFETs 104 include channel regions 107 formed of the well 120 material, a hard mask material 124 comprising an insulating material disposed over the gate 110, and sidewall spacers 126 also comprising an insulating material formed over sidewalls of the gate dielectric 108, gate 110, and hard mask 124. Isolation regions 122 that may comprise shallow trench isolation (STI) oxide or other insulating regions may be formed at various locations within the semiconductor region 102. The active FinFETs 104 may comprise p-channel metal oxide semiconductor (PMOS) devices or n-channel metal oxide semiconductor (NMOS) devices, or may be implemented in diode applications, as examples.

Region 112 may comprise active FinFETs 104 comprising PMOS devices in some embodiments. The semiconductor device 100 may include other regions (not shown) comprising active FinFETs comprising NMOS devices, for example. Alternatively, region 112 and other regions of the semiconductor device 100 may comprise the same type of devices, or other types of devices.

The top view of the semiconductor device 100 layout shown in FIG. 3 illustrates that the active FinFETs 104 extend horizontally over the surface of the workpiece 102 in a horizontal direction in the view shown. In some designs, a semiconductive material 128 will be formed in a later manufacturing process step that may form source and drain regions of the active FinFETs 104. Leads 130 will later be formed that connect to the semiconductive material 128 by vias 132, and contacts 136 will also later be formed that connect to the gates 110 of the active FinFETs 104 to leads 109. The contacts 130 and 136 may comprise slot contacts that also function as interconnects for the semiconductor device 100, for example.

Referring again to FIG. 2, after the layout for the active FinFETs 104 is determined, the dimensions d1a and d1b comprising the distances between the active FinFETs 104 are analyzed. Some distances between adjacent active FinFETs 104 may be larger than others. In the example shown in FIGS. 2 and 3, dimension d1a is greater than dimension d1b, for example.

The placement of inactive FinFETs 106 is determined based on the distances between the active FinFETs 104 in accordance with embodiments of the present disclosure. The amount of semiconductive material 128 desired to be formed between the plurality of active FinFETs 104 may also be considered in the placement of the inactive FinFETs 106, in some embodiments. The layout of the semiconductor device 100 is then changed to include the inactive FinFETs 106 in the design. The presence of the inactive FinFETs 106 improves the results of subsequent manufacturing process steps by providing a uniform structure, e.g., an improved, more homogeneous topography, in some embodiments. For example, if semiconductive material 128 is formed between the active FinFETs 104 in the design shown in FIGS. 2 and 3 using an epitaxial growth process, an insufficient amount of the semiconductive material 128 may be formed between active FinFETs 104 having large distances between them, such as dimension $d_{1a}$. This may have a deleterious effect on the semiconductor device 100 performance in some applications. An insufficient amount of semiconductive material 128, e.g., that does not completely reach the top surface of the channel regions 107 of the active FinFETs 104 may result in high leakage current from a drain of the active FinFETs 104 to the fins 102 (e.g., P-N junction leakage to the substrate).

Figure 4:
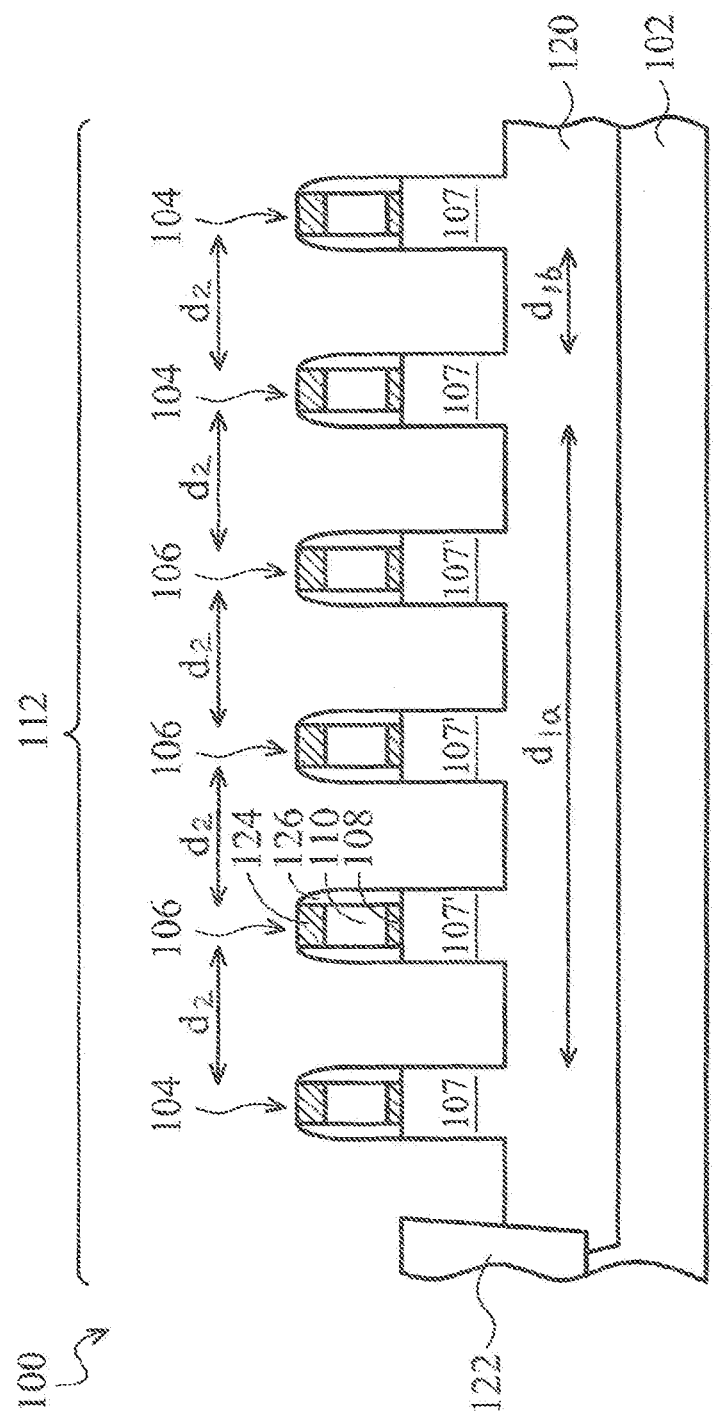
FIG. 4 is a cross-sectional view of a layout for a semiconductor device including a plurality of dummy FinFETs or electrically inactive FinFET structures disposed between the active FinFETs in accordance with an embodiment.

FIG. 4 is a cross-sectional view of the layout for the semiconductor device 100 shown in FIGS. 2 and 3 after the inclusion of a plurality of electrically inactive FinFETs 106 disposed between the active FinFETs 104 in accordance with an embodiment. The number of inactive FinFETs 106 included between the active FinFETs 104 is a function of the dimensions $d_{1a}$ and $d_{1b}$ comprising the distances between the active FinFETs 104. As examples, three inactive FinFETs 106 are disposed between active FinFETs 104 to accommodate dimension $d_{1a}$, and no inactive FinFETs 106 is disposed between active FinFETs 104 for dimension $d_{1b}$. Alternatively, one or more inactive FinFETs 106 may be included in the design.

In some embodiments, the layout for the semiconductor device 100 may be designed so that dimensions d2 comprising the distances between adjacent active FinFETs 104 and/or inactive FinFETs 106, and also between pairs of adjacent active FinFETs 104 and pairs of adjacent inactive FinFETs 106, is substantially the same, as shown in FIG. 4. Dimension d2 may comprise about 0.04 μm to about 3 μm, for example, although alternatively, dimension d2 may comprise other dimensions. Dimension d2 may vary in a design by core gate length and/or input/output (IO) gate length, for example. Dimension d2 may be selected to be substantially equal to dimension d1b comprising a smallest distance between two active FinFETs 104 in some embodiments, for example. Alternatively, dimensions d2 comprising the distances between adjacent active FinFETs 104 and/or inactive FinFETs 106, and between pairs of adjacent active FinFETs 104 and pairs of adjacent inactive FinFETs 106 may be different.

To manufacture the semiconductor device 100, the manufacturing process flow is performed as it would be without the inclusion of the inactive FinFETs 106, other than modifying a lithography mask used to pattern gates no and channel regions 107 of the active FinFETs 104. For example, first, a semiconductor region 102 is provided, as shown in FIG. 4. The semiconductor region 102 may comprise silicon or other semiconductor materials and may be covered by an insulating layer, for example. The semiconductor region 102 may also include other active components or circuits, not shown. The semiconductor region 102 may comprise silicon oxide over single-crystal silicon, for example. The semiconductor region 102 may include other conductive layers or other semiconductor elements, e.g., transistors, diodes, etc. Compound semiconductors, GaAs, InP, Si/Ge, or SiC, as examples, may be used in place of silicon. The semiconductor region 102 may comprise a silicon-on-insulator (SOI) or a germanium-on-insulator (GOI) substrate, as examples. The semiconductor region 102 may comprise a first semiconductive material in some embodiments described herein.

Isolation regions 122 may be formed in the semiconductor region 102, by patterning the semiconductor region 102 and filling the patterns with an insulating material. The isolation regions 122 may comprise silicon dioxide or other insulating materials, for example. The well 120 is formed in the semiconductor region 102 using an implantation process, and fins 107 and 107' are formed in the well 120 using lithography or other methods. The gate dielectric 108, gate 110, hard mask 124, and sidewall spacers 126 may be formed over the channel regions 107 and 107' after the formation of the channel regions 107 and 107'.

In another illustrative process, an oxide layer (not shown) may be formed over the surface of an unpatterned workpiece, and the oxide layer is then patterned to form therein a series of trenches, the trenches corresponding to the size and location of the subsequently formed active FinFETs 104 and inactive FinFETs 106. Using known epitaxial growth processes, fins 102 may be epitaxially grown.

Regardless of the fin formation process, a gate dielectric material 108 may be formed over the semiconductor region 102, and a gate material 110 comprising a semiconductive material such as silicon or other semiconductor materials is formed over the dielectric material layer 108. The hard mask 124 is deposited and patterned, and the hard mask 124 and optionally also a layer of photoresist (not shown) is then used as a mask while the gate material 110 and the gate dielectric material 108 are patterned. Sidewall spacers 126 are then formed on sides of the gate dielectric 108, gate 110, and hard mask 124. The sidewall spacers 126 may comprise silicon nitride, silicon dioxide, other insulators, or combinations or multiple layers thereof, formed by a deposition and an isotropic etch process, as examples, although alternatively, the sidewall spacers 126 may comprise other materials and may be formed using other methods.

The hard mask 124 is deposited over the gate material 110 and is patterned. The hard mask 124 and optionally also a layer of photoresist (not shown) are then used as a mask while the gate material 110, gate dielectric material 108, and also the well 120 of the semiconductor region 102 are patterned, forming the gates 110, gate dielectric 108, and channel regions 107 and 107' of the active and inactive FinFETs 104 and 106.

Advantageously, the inactive FinFETs 106 are patterned using the same lithography mask that the active FinFETs 104 are patterned with in some embodiments, which avoids requiring the use of an additional lithography mask.

The semiconductor region 102 of the active and inactive FinFETs 104 and 106, respectively, may extend horizontally by about 0.2 μm to about 50 μm and may comprise a width of about 50 nm, as an example, although alternatively, the semiconductor region 102 may comprise other dimensions, depending on the application, for example.

Figure 5:
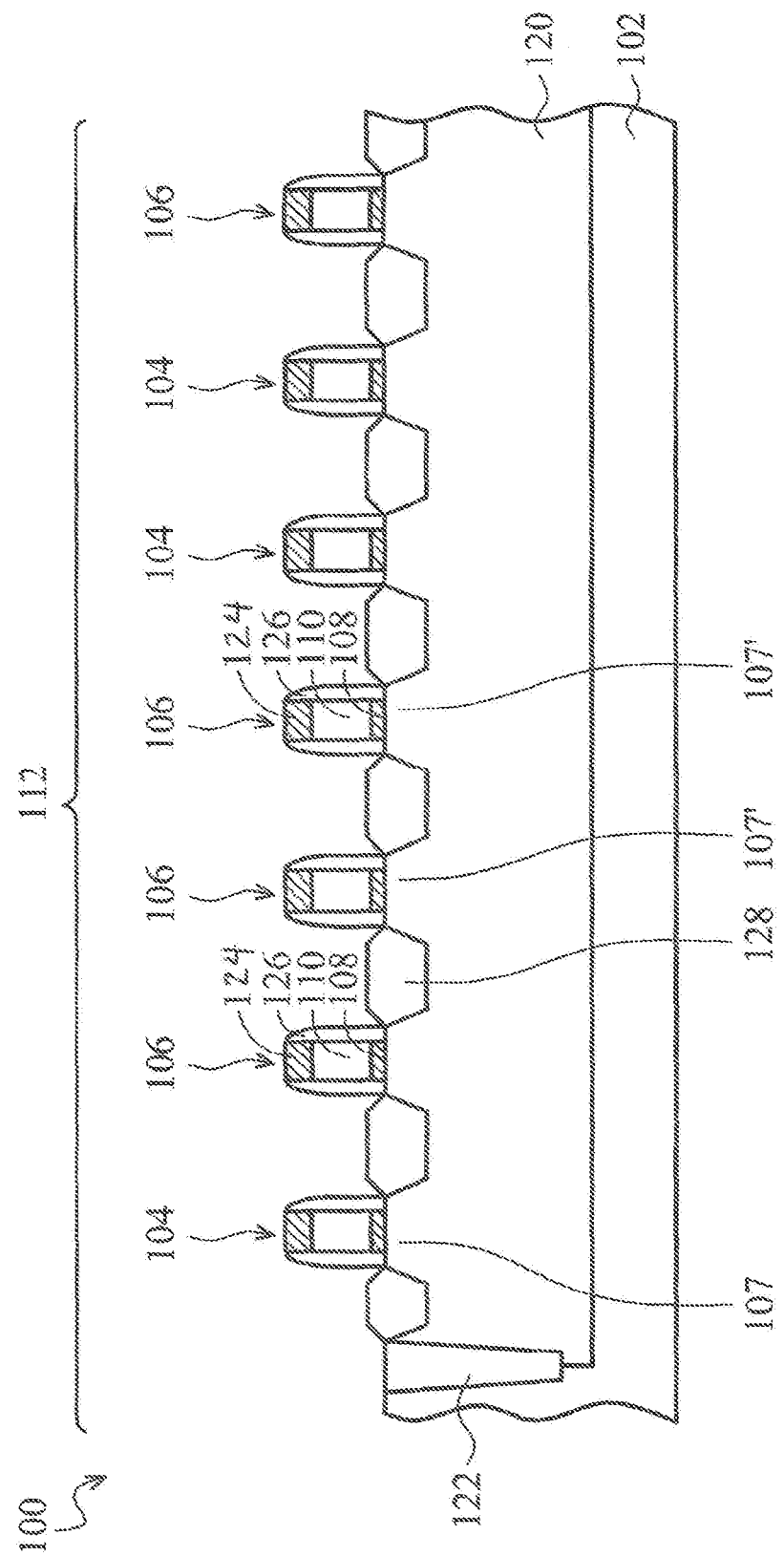
FIG. 5 shows a cross-sectional view of the semiconductor device shown in FIG. 4 after a semiconductive material has been formed between fins of the active FinFETs and inactive FinFET structures.

FIG. 5 shows a cross-sectional view of the semiconductor device 100 shown in FIG. 4 after a semiconductive material 128 has been formed between channel regions 107 and 107' of adjacent active FinFETs 104 and inactive FinFETs 106, between pairs of adjacent active FinFETs 104, and between pairs of adjacent inactive FinFETs 106. The formation of the semiconductive material 128 may comprise an epitaxial growth method, although the semiconductive material 128 may alternatively be formed by other methods. The hard mask 124 material and the sidewall spacer 126 material prevents the formation of the semiconductive material 128 on the top surface of the active and inactive FinFETs 104 and 106 and on the sidewalls of the gate 110 and gate dielectric 108 of the active and inactive FinFETs 104 and 106, respectively, during the epitaxial growth process. The semiconductive material 128 is grown proximate to the channel regions 107 and 107' of the active and inactive FinFETs 104 and 106, respectively. The semiconductive material 128 may comprise Si, SiGe, or SiC, as examples, although alternatively, the semiconductive material 128 may comprise other materials. The semiconductive material 128 may comprise SiP, SiCP, SiCN, or SiGeP for an NFET device, as another example.

In some embodiments, the semiconductive material 128 at least partially fills the spaces between adjacent channel regions 107 and 107' of the active FinFETs 104 and inactive FinFETs 106, adjacent pairs of channel regions 107 of the active FinFETs 104, and/or adjacent pairs of channel regions 107' of the inactive FinFETs 106. In other embodiments, the semiconductive material 128 may be formed wherein the top surface of the semiconductive material 128 is substantially coplanar with the top surface of the channel regions 107 and 107' of the active and inactive FinFETs 104 and 106 in some embodiments. In other embodiments, the semiconductive material 128 may have a top surface that is raised above the top surface of the channel regions 107 and 107', e.g., by about 45 nm or less, and may have a top surface that is lower than a gate height in some embodiments. Alternatively, the top surface of the channel regions 107 and/or 107' may comprise other relative dimensions, for example.

In some embodiments, the epitaxial growth of the semiconductive material 128 may comprise a "dual epitaxial" approach, wherein first regions 112 of the fins 102 are masked while one type of semiconductive material is epitaxially grown in other regions (not shown) of the semiconductor region 102, and the other regions of the fins 102 are masked while another type of semiconductive material is epitaxially grown in the first regions 112 of the fins 102, for example. A different type of semiconductive material 128 may be formed for NMOS and PMOS devices in some applications, for example. A semiconductive material 128 comprising Si may be used for an NFET device, and a semiconductive material 128 comprising SiGe may be used for a PFET device, in some applications. Alternatively, other types of semiconductor materials may be used for the semiconductive material 128.

The presence of the electrically inactive FinFETs 106 increases an amount of semiconductive material 128 growth proximate the electrically inactive FinFET structures 106, and thus increases the semiconductive material 128 growth proximate the active FinFETs 104 in close proximity to the inactive FinFET structures 106. Advantageously, the presence of the inactive FinFETs 106 results in the semiconductive material 128 completely filling the spaces between the channel regions 107 of the active and inactive FinFETs 104 and 106 in some embodiments, which prevents or reduces leakage current in the active FinFETs 104.

Figure 6:
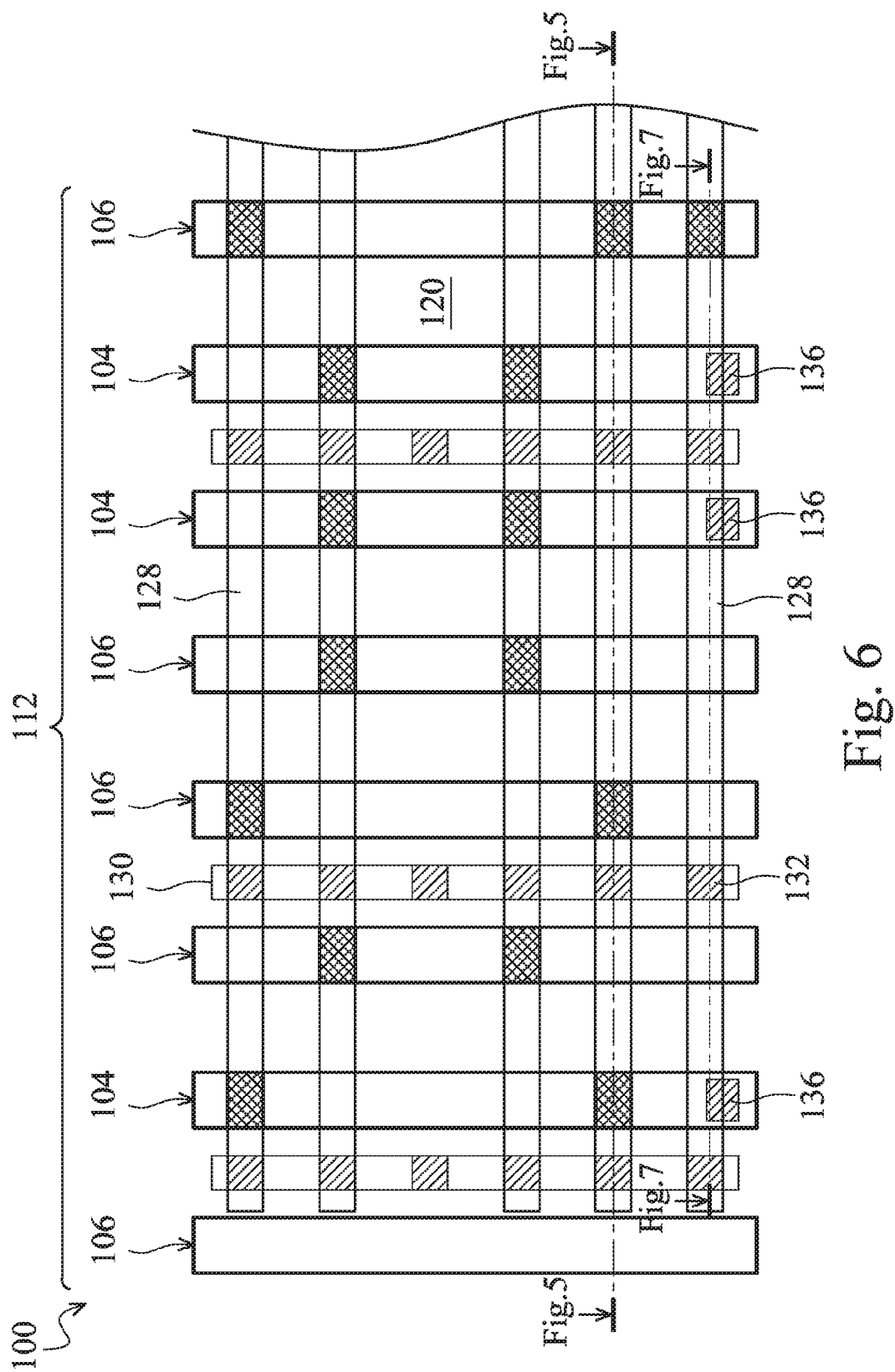
FIG. 6 shows a top view of the embodiment shown in FIG. 5.

FIG. 6 shows a top view of the embodiment shown in FIG. 5. One cross-sectional view is shown of FIG. 6 in FIG. 5, and another cross-sectional view is shown of FIG. 6 in FIG. 7. The electrically inactive FinFETs 106 are disposed over the semiconductor region 102 proximate the electrically active FinFETs 104. Contacts 136 are formed in upper material layers of the semiconductor device 100 over the active FinFETs 104. A contact 136 is coupled to at least some of the plurality of active FinFETs 104 in accordance with embodiments. No contacts are formed over the inactive FinFETs 106 in some embodiments, which are electrically inactive. Contacts 132 and vias 130 provide electrical contact to the semiconductive material 128 which forms source and drain regions of the active FinFETs 104 in some embodiments.

Figure 7:
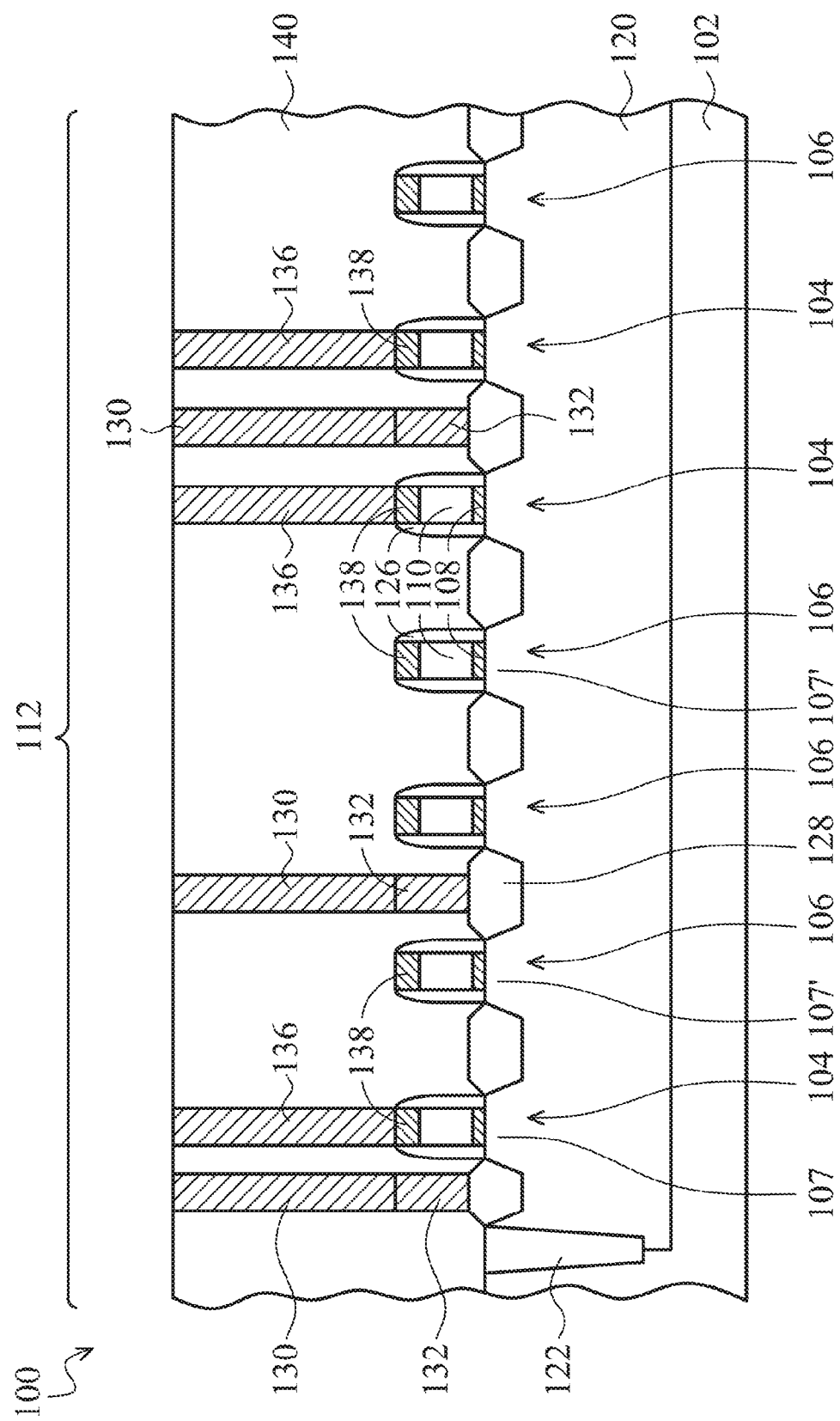
FIG. 7 show a cross-sectional view of the embodiment shown in FIGS. 5 and 6 after contacts have been formed over the active FinFETs.

FIG. 7 shows a cross-sectional view of region 112 of the embodiment shown in FIGS. 5 and 6 after the contacts 136 have been formed over the active FinFETs 104. The hard mask 124 is removed before the formation of the contacts 136, and an optional conductive or semiconductive material 138 may be formed over the gate 110 of the active and inactive FinFETs 104 and 106 before the formation of the contacts 136 over the active FinFETs 104. The material 138 may comprise a silicide forming using a silicidation process, or a semiconductive material formed using an epitaxial growth process. Alternatively, the material 138 may comprise other types of materials formed using other methods. In some embodiments, the material 138 may comprise NiSix, as another example. The material 138 may alternatively comprise other silicide materials.

The contacts 130 and 136 and vias 132 may be formed using single damascene processes or using a dual damascene process, for example, by depositing an insulating material 140 over the semiconductor device 100 over the active and inactive FinFETs 104 and 106, patterning the insulating material 140, and filling the patterns in the insulating material 140 with a conductive material. The contacts 130 and 136 and vias 132 may alternatively be formed using a subtractive etch process of a conductive material followed by deposition of the insulating material 140 between the contacts 130 and 136 and vias 132.

Figure 8:
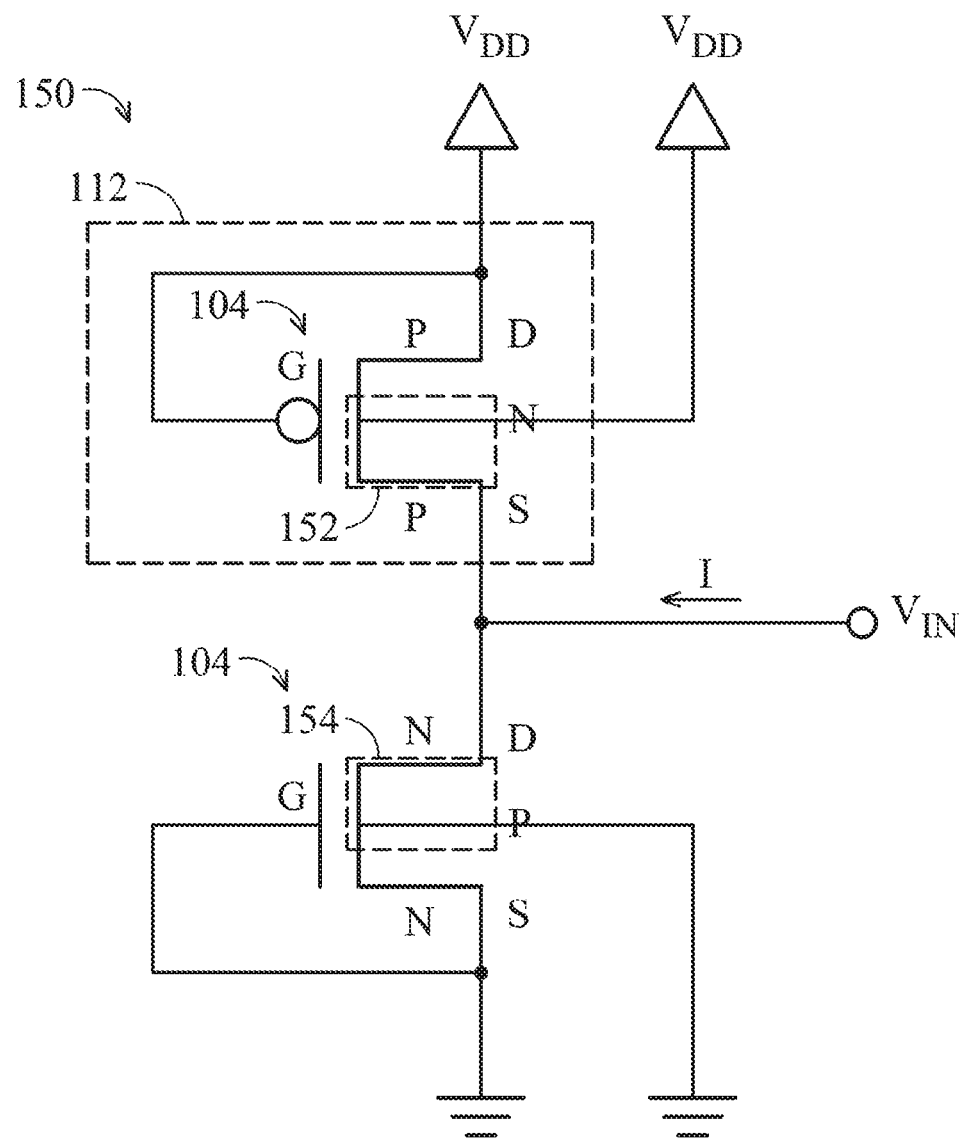
FIG. 8 shows a schematic of a circuit implementing the novel semiconductor devices described herein.

FIG. 8 shows a schematic of a circuit 150 implementing the novel semiconductor devices 100 described herein. The circuit 150 shown in FIG. 8 may be implemented as an ESD circuit for a logic device, an analog device, a memory device (such as a static random access memory (SRAM) device other types of memory devices), or an input/output (I/O) circuit, as examples, although alternatively, the circuit 150 may be used in other applications. In some embodiments, the active FinFET 104 described herein, manufactured with inactive FinFETs 106 proximate widely-spaced active FinFETs 104, may be implemented in the circuit 150 as a replacement for conventional planar devices in an ESD circuit application. The circuit 150 may comprise an I/O ESD diode that includes the dummy FinFETs 106 described herein, for example, or other diode applications.

Figure 9:
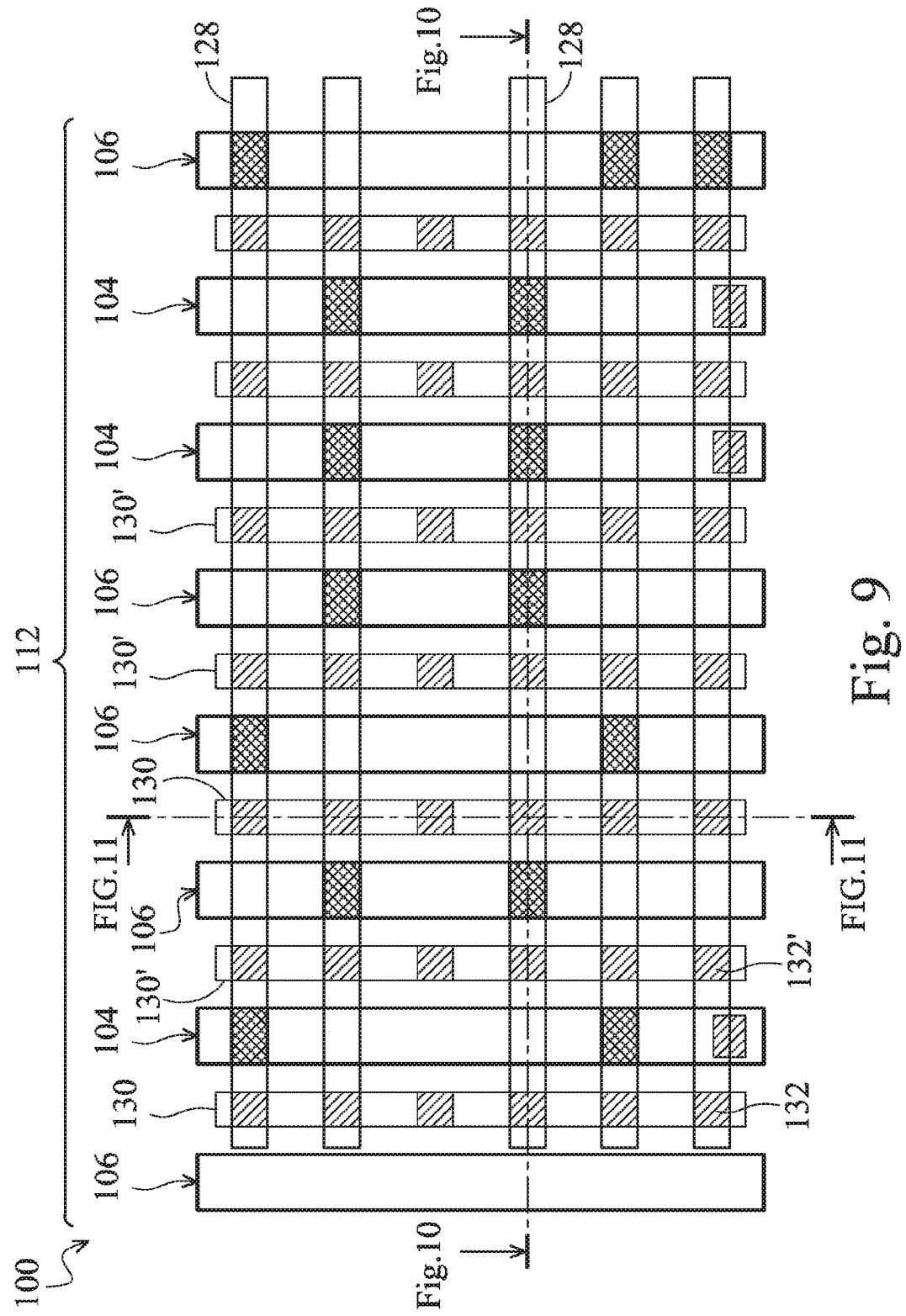
FIG. 9 is a top view of an embodiment wherein contacts are included between the dummy FinFETs.
Figure 10:
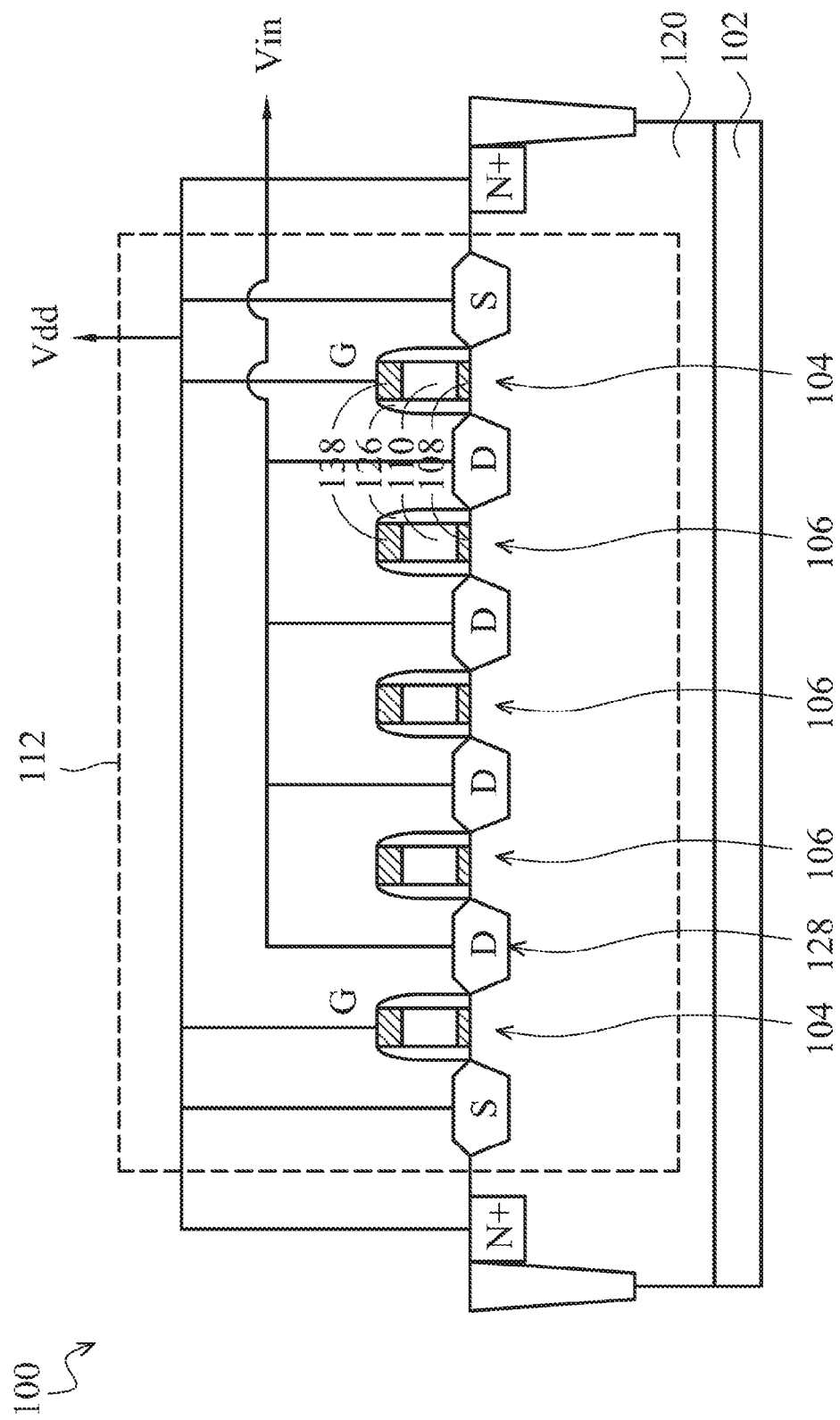
FIGS. 10 and 11 are cross-sectional views of portions of the embodiment shown in FIG. 9.
Figure 11:
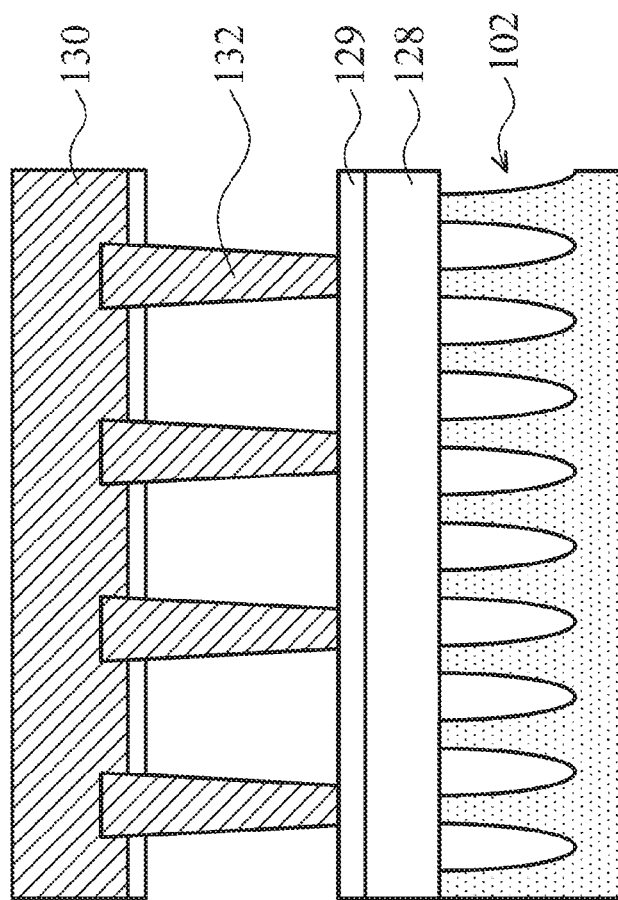

FIG. 9 is a top view of an embodiment wherein contacts 130 are included between the dummy FinFETs 106. FIGS. 10 and 11 are cross-sectional views of portions of the embodiment shown in FIG. 9. Contacts 130 comprising slot contacts and vias 132 may be formed between each of the dummy FinFETs 106 in some embodiments, as shown, which may comprise a common drain. Methods of manufacturing the semiconductor device 100 may include coupling contacts 130 to the second semiconductive material 128 between fins 107 of adjacent active FinFETs 104 and channel regions 107' of inactive FinFET structures 106, between channel regions 107' of pairs of adjacent inactive FinFET structures 106, or between channel regions 107 of pairs of adjacent active FinFETs 104, for example.

FIG. 10 illustrates electrical connections that may be made to the novel semiconductor devices 100. The semiconductive material 128 between each dummy FinFET 106 and between adjacent active FinFETs 104 and dummy FinFETs 106 may be electrically coupled to a Vin contact. Other portions of the semiconductor device 100 such as the gates G of the active FinFETs 104 and a portion (e.g., N+ portion) of the semiconductor region 102 may be coupled to a Vdd contact, as shown. FIG. 11 illustrates a view oriented perpendicular to the view shown in FIG. 10, showing a shape of the merged epitaxially grown semiconductive material 128 and a silicide 129 formed over the semiconductive material 128.

Figure 12:
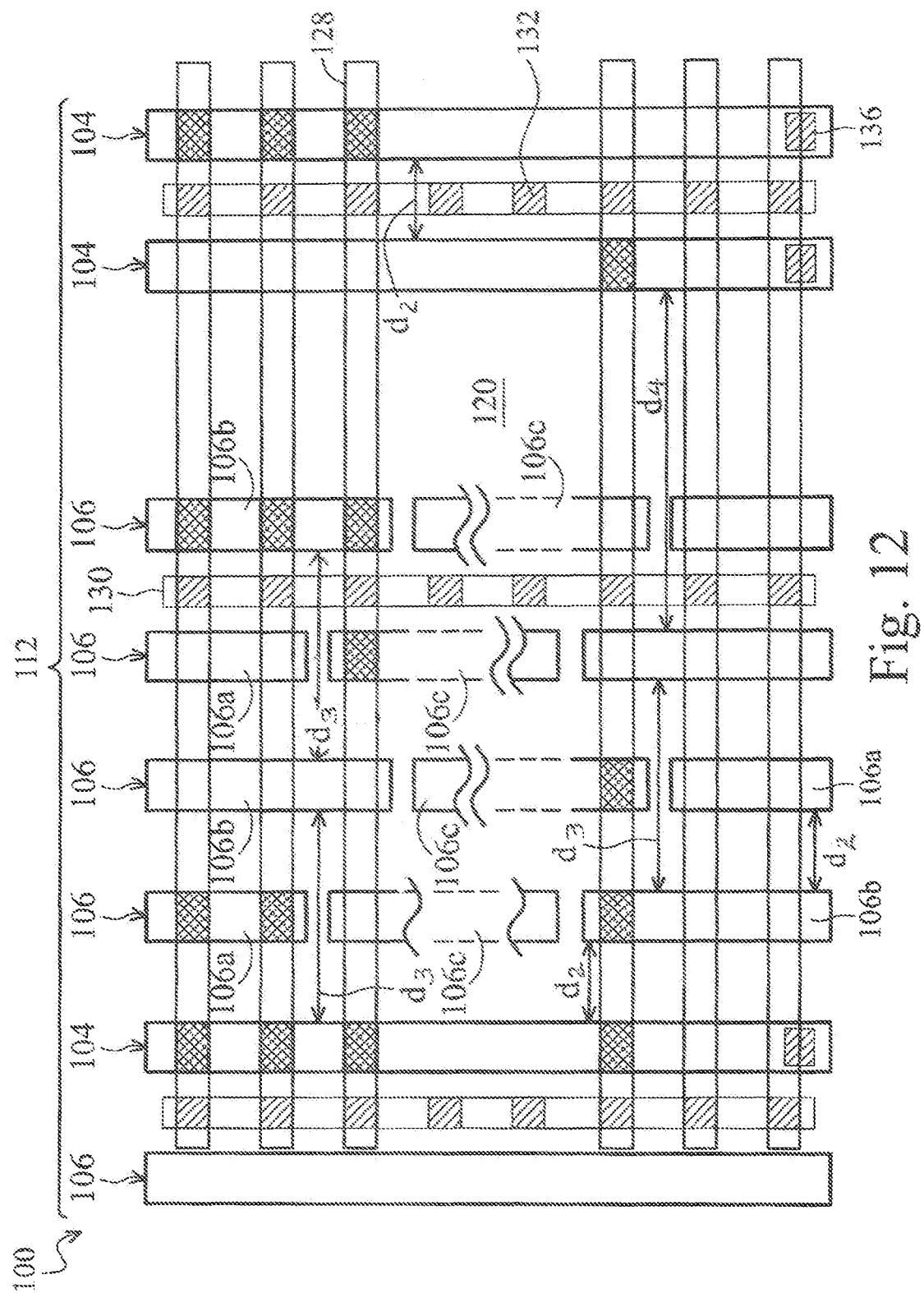
FIG. 12 is a top view of another embodiment of the present disclosure, wherein the inactive FinFET structures are fragmented and wherein the inactive FinFETs are disposed only in predetermined regions of the semiconductor device.

FIG. 12 is a top view of another embodiment of the present disclosure, wherein the inactive FinFETs 106 are fragmented and wherein the inactive FinFETs 106 are disposed only in predetermined regions of the semiconductor device 100. While the inactive FinFETs 106 are continuous in the embodiment shown in FIG. 6, the inactive FinFETs 106 in FIG. 12 are discontinuous or comprise multiple segments 106a, 106b, and 106c. The segments 106a, 106b, and 106c include the materials described earlier for the continuous inactive FinFETs 106: the channel regions 107', gate dielectric 108, and gates 110. Dimensions d2 comprising the distances between the active FinFETs 104 and adjacent inactive FinFETs 106 and between pairs of adjacent inactive FinFET 106 segments may comprise similar dimensions previously described for dimension d2 of FIG. 4. The dimensions d3 comprising the distances between alternating active and inactive FinFETs 104 and 106 may comprise about twice dimension d2 plus a width of a channel region 107 or 107' of an active or inactive FinFET 104 and 106. Dimension d4 also illustrates that there may be regions larger than dimensions d2 and d3 that do not include the inactive FinFETs 106, in accordance with some embodiments. The inactive FinFETs 106 may be placed in some regions of the layout where they would have beneficial use in the semiconductor device 100, yet may be omitted in other regions.

In the cross-sectional views shown in FIGS. 5, 7, 10, and 11, merged epitaxial growth of the semiconductive material 128 is shown between the channel regions 107 and/or 107' of the active and inactive FinFETs 104 and 106, wherein the semiconductive material 128 completely fills the spaces between the channel regions 107 and/or 107'. Alternatively, the epitaxial growth of the semiconductive material 128 may be controlled and optimized so that the channel regions 107 and 107' maintain their shape topographically: the epitaxial growth of the semiconductive material 128 may be non-merged (not shown in the drawings), so that the semiconductive material 128 partially fills the spaces between the channel regions 107 and/or 107', in some embodiments. In other embodiments, the epitaxial growth of the semiconductor material 128 may optionally overfill the spaces between the channel regions 107 and/or 107', as shown in FIGS. 5, 7, and 10.

Figure 13:
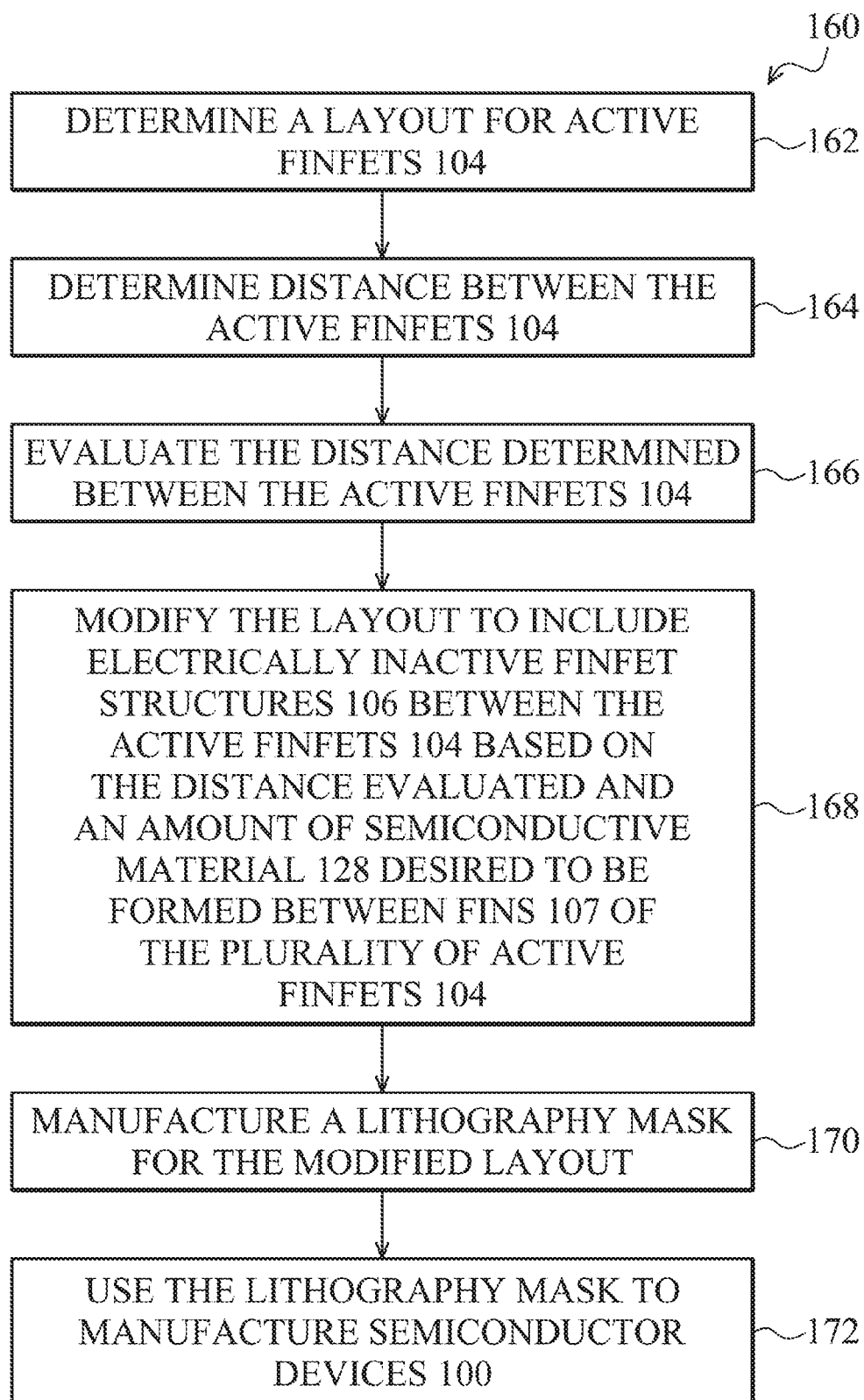
FIG. 13 is a flow chart of a method of designing a semiconductor device in accordance with an embodiment of the present disclosure.

FIG. 13 is a flow chart 160 of a method of designing a semiconductor device 100 in accordance with an embodiment of the present disclosure. The method includes determining a layout for active FinFETs 104 (step 162), as shown in FIGS. 2 and 3. The distance (e.g., dimensions d1a and d1b of FIG. 2) between the active FinFETs 104 is determined (step 164), and the distance determined between the active FinFETs 104 is evaluated (step 166). The method includes modifying the layout to include electrically inactive FinFET structures 106 between the active FinFETs 104, based on the distance evaluated and an amount of semiconductive material 128 desired to be formed between channel regions 107 of the plurality of active FinFETs 104 (step 168). A lithography mask is then manufactured for the modified layout (step 170). The lithography mask is then used to manufacture semiconductor devices 100 (step 172). A layout for a lithography mask used for gate 110 pattern definition of the active FinFETs 104 may be altered to include a pattern definition for the novel dummy FinFETs 106 described herein, for example.

Embodiments of the present disclosure include semiconductor devices 100 including active and inactive FinFETs 104 and 106, and methods of manufacturing thereof. Embodiments of the present disclosure also design methods for semiconductor devices 100 that include both the novel active and inactive FinFETs 104 and 106 described herein.

Advantages of embodiments of the disclosure include providing novel semiconductor devices 100 that include both active and inactive FinFET devices 104 and 106 and structures. The inactive FinFETs 106 improve semiconductor device 100 performance by improving epitaxial growth processes between and proximate channel regions 107 of the active FinFETs 104. Inserting the dummy FinFETs 106 between widely-spaced active FinFETs 104 resolves a loading effect problem of epitaxial growth of semiconductive material 128 that may be formed between channel regions 107 of the active FinFETs 104 in some embodiments. The improved, more uniform merged epitaxial growth of the semiconductive material 128 prevents contact etch-through, e.g., during contact 136 formation, reducing or preventing leakage current of the active FinFETs 104. A semiconductive material 128 having improved, uniform epitaxial growth results in improved silicide 129 formation, such as NiSix, which may be formed over the semiconductive material 128 prior to the formation of the contacts 136. The improved silicide 129 formation can prevent high junction leakage resulting from contact 136 etch-through, for example. The improved epitaxial growth window provided by the inclusion of the novel dummy FinFETs 106 avoids an epitaxial merge problem in widely-spaced active FinFET 104 regions.

Furthermore, the dummy FinFETs 106 may easily be tested, e.g., to examine the structure thereof or analyze the surface elements, using a scanning electron microscope (SEM) image, transmission electron microscopy (TEM) image, or energy dispersive X-ray (EDX) analysis. No additional lithography masks and no additional manufacturing process steps are required to fabricate the inactive FinFETs 106. The novel dummy FinFETs 106 and designs described herein are easily implementable in manufacturing process flows for semiconductor devices 100.

In accordance with one embodiment of the present disclosure, a semiconductor device includes an active FinFET disposed over a workpiece comprising a first semiconductive material, the active FinFET comprising a first fin. An electrically inactive FinFET structure is disposed over the workpiece proximate the active FinFET, the electrically inactive FinFET comprising a second fin. A second semiconductive material is disposed between the first fin and the second fin.

In accordance with another embodiment, a method of manufacturing a semiconductor device includes providing a workpiece, the workpiece comprising a first semiconductive material, and forming a plurality of active FinFETs over the workpiece, each of the plurality of active FinFETs comprising a first fin. The method includes forming a plurality of electrically inactive FinFET structures over the workpiece proximate the plurality of active FinFETs, each of the plurality of electrically inactive FinFET structures comprising a second fin, and partially filling spaces between adjacent first fins and second fins, adjacent pairs of first fins, or adjacent pairs of second fins with a second semiconductive material.

In accordance with yet another embodiment, a method of designing a semiconductor device includes determining a layout for a plurality of active FinFETs, determining a distance between the plurality of active FinFETs, and evaluating the distance determined between the plurality of active FinFETs. The layout is modified to include an electrically inactive FinFET structure between two of the plurality of active FinFETs based on the distance evaluated and an amount of semiconductive material desired to be formed proximate fins of the plurality of active FinFETs.

In accordance with yet another embodiment, a semiconductor device is provided. The semiconductor device includes a fin extending from a substrate, a first active gate electrode over the fin, and a first inactive gate electrode over the fin, the inactive gate electrode being adjacent to the first active gate electrode such that no intermediate gate electrodes exist between the inactive gate electrode and the first active gate electrode. A first recess in the fin is between the first active gate electrode and the inactive gate electrode, and a semiconductor material is positioned in the first recess, the semiconductor having a different lattice constant than the fin.

In accordance with yet another embodiment, a semiconductor device is provided. The semiconductor device includes a first active fin field effect transistor (FinFET), the first active FinFET comprising a first fin, the first fin comprising a first semiconductive material. An electrically inactive FinFET structure is disposed over the first fin proximate the first active FinFET, and a second semiconductive material is disposed between the first FinFET and the electrically inactive FinFET, the second semiconductive material being different than the first semiconductive material.

In accordance with yet another embodiment, a semiconductor device is provided. The semiconductor device includes a first set of fins extending from a substrate, the first set of fins being parallel to each other, and a first active gate electrode extending over the first set of fins. A second active gate electrode extends over the first set of fins, the first active gate electrode being parallel to the second active gate electrode, and a first inactive gate electrode extends over one or more of the first set of fins, the first inactive gate electrode being interposed between the first active gate electrode and the second active gate electrode. A recess is in a first fin of the first set of fins, the recess being interposed between the first inactive gate electrode and the first active gate electrode, and a semiconductor material is in the recess, the semiconductor material having a different lattice constant than the substrate.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A device comprising:
    a plurality of gate electrodes comprising:
        a first active gate electrode and a second active gate electrode; and
        a plurality of dummy electrodes between the first active gate electrode and the second active gate electrode, wherein the plurality of dummy gate electrodes have a substantially uniform pitch; and
    a plurality of epitaxy source/drain regions between neighboring ones of the plurality of gate electrodes.

2. The device of claim 1, wherein the plurality of epitaxy source/drain regions are electrically interconnected.

3. The device of claim 2, wherein the plurality of epitaxy source/drain regions are allocated as a plurality of pairs, with each pair located on opposite side of one of the plurality of dummy electrodes, and two epitaxy source/drain regions in each of the plurality of pairs are interconnected.

4. The device of claim 1 further comprising an input node connected to the plurality of epitaxy source/drain regions.

5. The device of claim 4 further comprising:
    a power supply node configured to provide a positive power supply voltage;
    a first source/drain region on a side of the first active gate electrode; and
    a second source/drain region on a side of the second active gate electrode, wherein the first source/drain region, the second source/drain region, the first active gate electrode, and the second active gate electrode are connected to the power supply node.

6. The device of claim 1 further comprising:
    a first source/drain region and second source/drain region on opposite sides of the first active gate electrode, wherein the first source/drain region is connected to the first active gate electrode to form a first diode; and
    a third source/drain region and a fourth source/drain region on opposite sides of the second active gate electrode, wherein the third source/drain region is connected to the second active gate electrode to form a second diode.

7. The device of claim 6, wherein the first diode and the second diode are connected in parallel.

8. The device of claim 1, wherein the first active gate electrode, the second active gate electrode, and the plurality of dummy gate electrodes are substantially equally spaced.

9. A device comprising:
    a first active Fin Field-Effect Transistor (FinFET) comprising:
        a first source region;
        a first gate electrode; and
        a first drain region on an opposite side of the first gate electrode than the first source region, wherein one of the first source region and the first drain region is connected to the first gate electrode to form a first diode;
    a second active FinFET comprising:
        a second source region;
        a second gate electrode; and
        a second drain region on an opposite side of the second gate electrode than the second source region, wherein one of the second source region and the second drain region is connected to the second gate electrode to form a second diode; and a plurality of dummy gate electrodes and a plurality of dummy source/drain regions arranged between the first drain region and the second drain region, wherein the plurality of dummy gate electrodes and a plurality of dummy source/drain regions are allocated alternatingly, and the plurality of dummy source/drain regions are interconnected.

10. The device of claim 9, wherein the first diode and the second diode are connected in parallel.

11. The device of claim 9, wherein the plurality of dummy gate electrodes are electrically floating.

12. The device of claim 9 further comprising an input node and a positive power supply node, wherein the first diode and the second diode are coupled between the input node and the positive power supply node to act as an electrostatic discharge (ESD) device.

13. The device of claim 9 further comprising a positive power supply node connected to the first source region, the first gate electrode, the second source region, and the second gate electrode.

14. The device of claim 9, wherein the first drain region and the second drain region are both connected to the plurality of dummy source/drain regions.

15. The device of claim 9, wherein the first gate electrode, the second gate electrode, and the plurality of dummy gate electrodes have a uniform pitch.

16. A device comprising:
a first active Fin Field-Effect Transistor (FinFET) comprising:
a first source region;
a first gate electrode; and
a first drain region, wherein the first source region and the first drain region are on opposite sides of the first gate electrode; and
a plurality of dummy gate electrodes and a plurality of dummy source/drain regions immediately neighboring the first drain region, wherein the plurality of dummy gate electrodes and the plurality of dummy source/drain regions are allocated alternatingly, and the plurality of dummy gate electrodes are electrically floating.

17. The device of claim 16 further comprising a second active FinFET comprising:
a second source region;
a second gate electrode, wherein the first source region, the first gate electrode, the second source region, and the second gate electrode are interconnected, and the plurality of dummy gate electrodes and the plurality of dummy source/drain regions are between the first source region and the second source region; and
a second drain region connected to the plurality of dummy source/drain regions.

18. The device of claim 17, wherein the first gate electrode, the second gate electrode, and the plurality of dummy gate electrodes are distributed with a uniform pitch.

19. The device of claim 16 further comprising a positive power supply node and a voltage input node, wherein the first source region is connected to the first gate electrode to form a diode with the first drain region, and the diode is configured to function as an electrostatic discharge (ESD) device, with the diode connected between the positive power supply node and the voltage input node.

20. The device of claim 19, wherein the diode is comprised in an Input-output (IO) ESD device.

* * * * *